(12) United States Patent
Abatchev et al.

(10) Patent No.: US 7,112,533 B2
(45) Date of Patent: Sep. 26, 2006

(54) PLASMA ETCHING SYSTEM AND METHOD

(75) Inventors: Mirzafer K. Abatchev, Boise, ID (US);
Brad J. Howard, Boise, ID (US);
Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 10/261,920

(22) Filed: Oct. 1, 2002

(65) Prior Publication Data
US 2003/0024643 A1 Feb. 6, 2003

Related U.S. Application Data

(62) Division of application No. 09/652,865, filed on Aug. 31, 2000, now abandoned.

(51) Int. Cl.
*H01L 21/302* (2006.01)

(52) U.S. Cl. .................................. 438/706; 438/714

(58) Field of Classification Search ................ 438/700, 438/706, 710, 714, 719, 720, 723, 724, 729
See application file for complete search history.

(56) References Cited

U.S. PATENT DOCUMENTS

| | | | | |
|---|---|---|---|---|
| 4,808,258 A | * | 2/1989 | Otsubo et al. | 438/710 |
| 5,542,559 A | * | 8/1996 | Kawakami et al. | 216/67 |
| 5,783,100 A | | 7/1998 | Blalock et al. | |
| 5,815,388 A | * | 9/1998 | Manley et al. | 363/63 |
| 5,846,885 A | * | 12/1998 | Kamata et al. | 438/729 |
| 5,985,375 A | | 11/1999 | Donohoe et al. | |
| 5,998,931 A | | 12/1999 | Donohoe | |
| 6,010,967 A | | 1/2000 | Donohoe et al. | |
| 6,030,902 A | | 2/2000 | Donohoe | |
| 6,106,737 A | | 8/2000 | Tomoyasu et al. | |
| 6,110,287 A | | 8/2000 | Arai et al. | |
| 6,358,835 B1 | * | 3/2002 | Kanamura | 438/618 |
| 2001/0011887 A1 | * | 8/2001 | Sturm et al. | 324/109 |

FOREIGN PATENT DOCUMENTS

| | | |
|---|---|---|
| JP | 61-13625 A | 1/1986 |
| JP | 7-249614 A | 9/1995 |
| JP | 7-288191 A | 10/1995 |
| JP | 10-150025 A | 6/1998 |
| JP | 10-303188 A | 11/1998 |
| JP | 11-3879 A | 1/1999 |
| JP | 2000-12524 A | 1/2000 |

* cited by examiner

*Primary Examiner*—Kin-Chan Chen
(74) *Attorney, Agent, or Firm*—Knobbe Martens Olson & Bear, LLP

(57) ABSTRACT

A system and a process for plasma etching a semiconductor device. The technique comprises periodically applying a heightened voltage bias during the plasma etching process so as to reduce accumulated charge on the surface of the semiconductor device during plasma etching of the device. In one embodiment, a heightened positive voltage and heightened negative voltage is applied to the semiconductor device while plasma etching is occurring to thereby induce charge to be removed from the semiconductor device.

8 Claims, 4 Drawing Sheets

PLASMA ETCHING SYSTEM AND METHOD

RELATED APPLICATIONS

This application is a divisional of U.S. application Ser. No. 09/652,865, now abandoned, filed Aug. 31, 2000.

BACKGROUND OF THE INVENTION

1. Field of the Invention

The present invention relates to semiconductor processing techniques and, in particular, concerns a method and a system that allows for more efficient plasma etching of semiconductor devices as a result of reducing accumulated charge on the semiconductor device during the plasma etching process.

2. Description of the Related Art

The manufacturing of semiconductor devices often requires the formation of openings within the substrate or in one or more overlying layers of the semiconductor device. Typically, these openings are formed such that devices can be formed in the openings. Additionally, openings are formed in layers so that interconnecting structures can be formed in the openings to allow for interconnection with devices either formed in underlying layers of the semiconductor device or in the substrate of the semiconductor device. These openings are typically formed using etching processes wherein a portion of the semiconductor device is exposed to an etchant that removes the exposed portion.

As device dimensions have become increasingly smaller, it is desirable that openings formed in semiconductor devices be formed to extremely small tolerances. To accomplish this, it is desirable to use etching techniques that are relatively anisotropic such that the sidewalls of openings are as vertical as possible. Moreover, there is an increasing desire to use dry etching processes, as opposed to wet etching processes, due to the anisotropic nature of ion-assisted dry etching.

Plasma etching is a type of dry etching that can be very anisotropic and is preferred in many semiconductor processes. Typically, when plasma etching, a chemical etchant gas is positioned within a chamber and an energy source is applied to the chamber so as to energize the chemical etchant gas into a plasma state. More particularly, the pressure inside of the chamber is reduced by a vacuum system and a power supply creates an electric or electromagnetic field in the chamber through electrodes positioned within the chamber. The charged electric or electromagnetic field energizes the chemical etchant gas into a plasma state. In a plasma state, the chemical etchant gas is transformed into a disassociated mixture of uncharged neutrals as well as electrons and ions. Preferably, the chemical etchant gas that is introduced into the chamber is selected such that, when it is transformed into a plasma state, has chemistry that is selective to particular materials on the semiconductor device. Moreover, the typical plasma etching system induces an electrical field such that ions are directed towards the exposed surface of the wafer. The gas conditions are preferably selected so that the ions react with the exposed material on the semiconductor device thereby removing the exposed material from the semiconductor device.

Plasma etching can be very anisotropic resulting in etched openings of very high tolerances. However, it has been observed that the flux of charged particles around the semiconductor device during plasma etching results in the surfaces of the semiconductor device accumulating charge. The density of the accumulated charge on the semiconductor device is dependent upon the plasma parameters, e.g., plasma uniformity, energy and angular distribution of ions and electrons, as well as being dependent upon the geometry of the semiconductor device. Unfortunately, an increase in surface charge and, in particular, an increase in surface charge at particular regions of the semiconductor device, can result in etch non-uniformity, etch stop, and etch profile distortions. The term "aspect-ratio-dependent charging" is used to describe these failures if they are caused by the surface charge effect.

In particular, as surface charge builds up on the surface of the semiconductor device, this charge generates an electric field which affects subsequently accelerated ions and electrons that are being directed toward the semiconductor device. A build-up of charge on the semiconductor device adjacent the area to be etched that is of the same polarity as the ions that are participating in etching the semiconductor device can hinder or even halt etching of the exposed surface. Similarly, a build-up of opposite polarity charge will attract ions thereby diverting ions which can result in non-uniformity of etching. As device dimensions become increasingly smaller, the problems associated with build-up of surface charge during plasma etching can significantly hinder the ability to form more uniformly shaped openings in the semiconductor device through plasma etching.

In fact, many different types of plasma processes are negatively affected by build up of charge in this manner. For example, plasma induced chemical vapor deposition can also result in accumulations of charge in the same manner as described above in connection with plasma etching. This build of charge can similarly affect deposition rates and result in localized areas of non-uniform deposition of semiconductor material. Hence, plasma processing of many different types are subject to difficulties stemming from charge build up.

From the foregoing, it will be appreciated that there is a continuing need for etching techniques that can be used to form extremely small openings, e.g., in the submicron, and sub-quarter micron, range, to a high degree of tolerance. To this end, there is a continuing need for plasma etching techniques wherein the etching is less affected by build-up of surface charge.

SUMMARY OF THE INVENTION

The aforementioned needs are satisfied in one aspect by a method of plasma etching a semiconductor device. In this aspect, the plasma gas in a chamber is transformed into a plasma and the plasma then etches the semiconductor device. While the plasma etching is occurring, the semiconductor device is periodically biased so as to reduce the build-up of surface charge on the semiconductor device during the plasma etching process. The reduction in the surface charge advantageously reduces plasma etch stop problems and plasma etch nonuniformities.

In another aspect, a method of performing a plasma operation on a semiconductor device is provided. In this aspect, the plasma operation can be comprised of any of a number of plasma operations including plasma etching or plasma induced chemical vapor deposition. In this aspect, while the plasma operation is occurring charge that accumulates as a result of the plasma operation is periodically dissipated by application, in one embodiment, of a higher magnitude voltage waveform. The application of the higher magnitude voltage waveform dissipates accumulated charge thereby resulting in the plasma operation being more uniform.

From the foregoing, it will be appreciated that these aspects of the teaching disclosed herein provide a unique method for plasma etching semiconductor devices that reduces surface charge on the semiconductor device. The reduction in the surface charge results in more uniform plasma etching and also allows for plasma etching to greater depths with less profile distortion, such as undercutting or bowing. These and other objects and advantages of the teaching disclosed herein will become more fully apparent from the following description taken in conjunction with the accompanying drawings.

DETAILED DESCRIPTION OF THE PREFERRED EMBODIMENTS

Figure 1A:
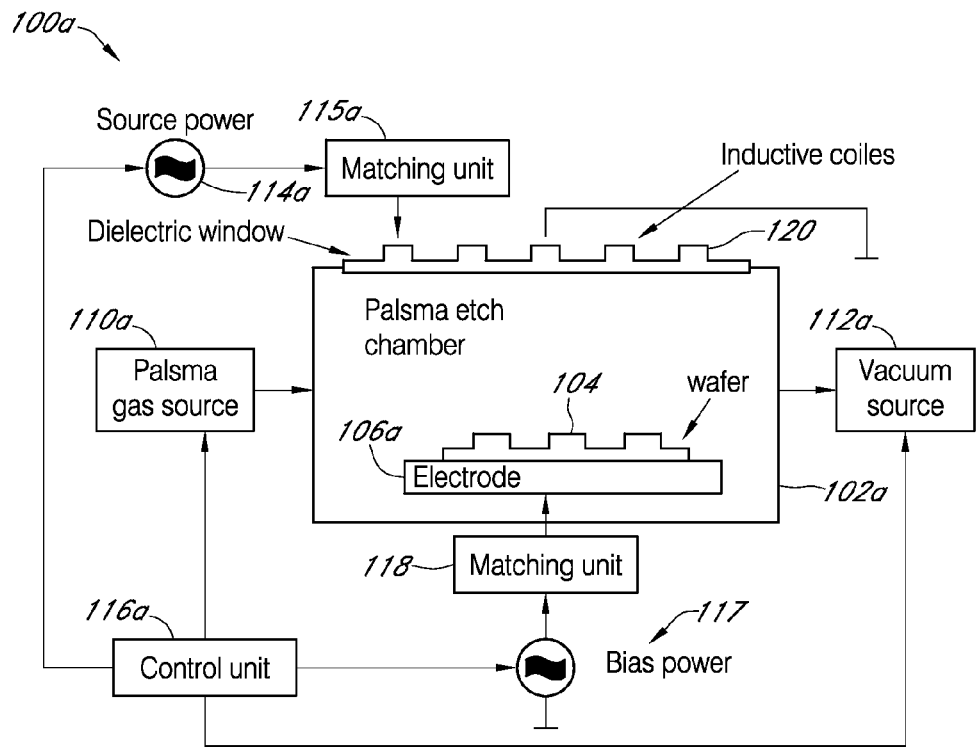
FIGS. 1A and 1B are schematic illustrations of exemplary plasma etching systems of the illustrated embodiment.
Figure 1B:
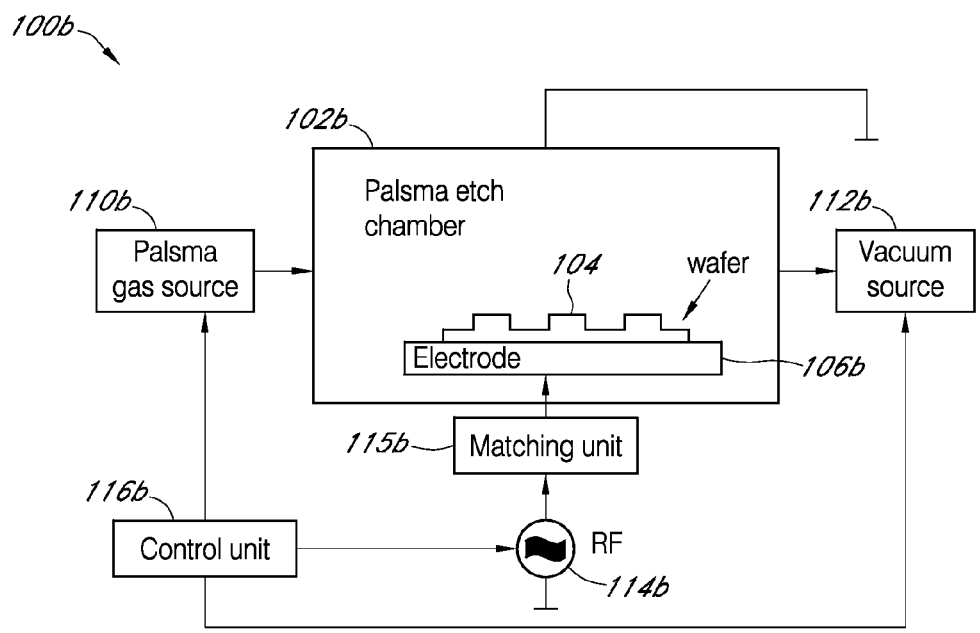

Reference will now be made to the drawings wherein like numerals refer to like parts throughout. FIGS. 1A and 1B are two exemplary block diagrams of plasma etching systems 100a, 100b similar to those systems used in the prior art. The embodiment of FIG. 1A is a block diagram of a high density plasma etcher such as a LAM type TCP 9400 plasma etcher manufactured by Lam Research Inc. of Fremont, Calif.

The plasma etching system 100a includes a plasma etch chamber 102a which can be evacuated by a vacuum source 112a and also receives a plasma gas from a plasma gas source 110a. The chamber includes an electrode or platform 106a that is adapted to hold a plurality of semiconductor wafers 104 in a known manner. A plurality of inductive coils 120 are preferably mounted about the chamber 102a and a voltage waveform is applied to the coils from a source power supply 114a via a matching unit 115a. A voltage waveform is also provided from a bias power supply 117 via a matching unit 118 to the electrode 106a positioned within the chamber 102a that receives the semiconductor wafers 104.

The combination of the signal being provided to the inductive coils 120 and the signals being provided to the electrode 106a results in the transformation of the feed gas from the plasma gas source 110a into a plasma comprised of charged and uncharged particles including reactive ions and electrons. In this embodiment, the application of the signals to the electrode 106a and the inductive coils 120 is under the control of a well known control unit 116a.

FIG. 1B illustrates another embodiment of a plasma etching system 100b which is comprised of a Reactive Ion Etching System that can be used to etch semiconductor wafers according to the present invention. In this embodiment, the system 100b includes a plasma etch chamber 102b which can be evacuated by a vacuum source 112b and also receives plasma gas from a plasma gas source 110b. The system 100b includes a platform or electrode 106b that receive a plurality of semiconductor wafers 104 in a known manner. The platform 106b receives an RF signal from an RF power supply 114b via a matching unit 115b. The RF signal transforms the plasma gas provided to the chamber from the plasma gas source 110b into a plasma comprised of charged particles and reactive ions The systems 100a and 100b are two typical systems used for plasma etching and are substantially similar to systems known in the art. As illustrated there are two different types of plasma etching systems, including systems having parallel plate geometry systems with 1 or 2 power supplies providing power to one or two electrodes. Alternatively, there are also plasma etching systems that are dual power systems which typically have inductive or microwave source power and capacitively coupled bias power. Some exemplary parallel plate systems include the plasma etching systems available from TEL of Tokyo, Japan, and the LAM EXELAN available from LAM Research Inc. of Fremont, Calif. Some exemplary dual power systems includes the IPS system available from Applied Materials Inc. of Santa Clara, Calif. and the ECR system available from Hitachi Corp. of Kudamatsu City, Japan.

While various examples of plasma etching systems have been provided herein, it will be appreciated from the following discussion that the exact configuration of plasma etching systems of the present invention can vary from the system illustrated in FIGS. 1A and 1B. The present invention can, in fact, be implemented on any of a number of well-known plasma etching systems capable of providing the increased bias during the plasma etching process in the manner described hereinbelow without departing from the spirit of the present invention.

While plasma etching systems are suitable for etching exposed regions of semiconductor devices from wafers, one difficulty is that electric charge accumulates on the locations on the surface of the semiconductor device and the accumulation of charge can either inhibit further plasma etching or can produce non-uniform etching and undercutting. To address this particular problem, the control units 116a, 116b of the systems 100a, 100b are adapted to provide an increased voltage bias or waveform having an increased magnitude during the plasma etching process so as to reduce the accumulation of charged particles on the surface of the semiconductor wafers 104.

It will be further appreciated from the following discussion, that the process for diminishing accumulated charge on a semiconductor surface of the preferred embodiment has application to other plasma processes. As will be described in greater detail hereinbelow, charge can accumulate in a number of different plasma processes where a gas is energized in a chamber to form a plasma. The charge can affect the process by inhibiting ions from interacting with the surface. Hence, by applying the increased voltage bias or waveform having an increased magnitude during the plasma process, the accumulated charge can be dissipated thereby allowing for improved plasma processes.

Figure 2A:
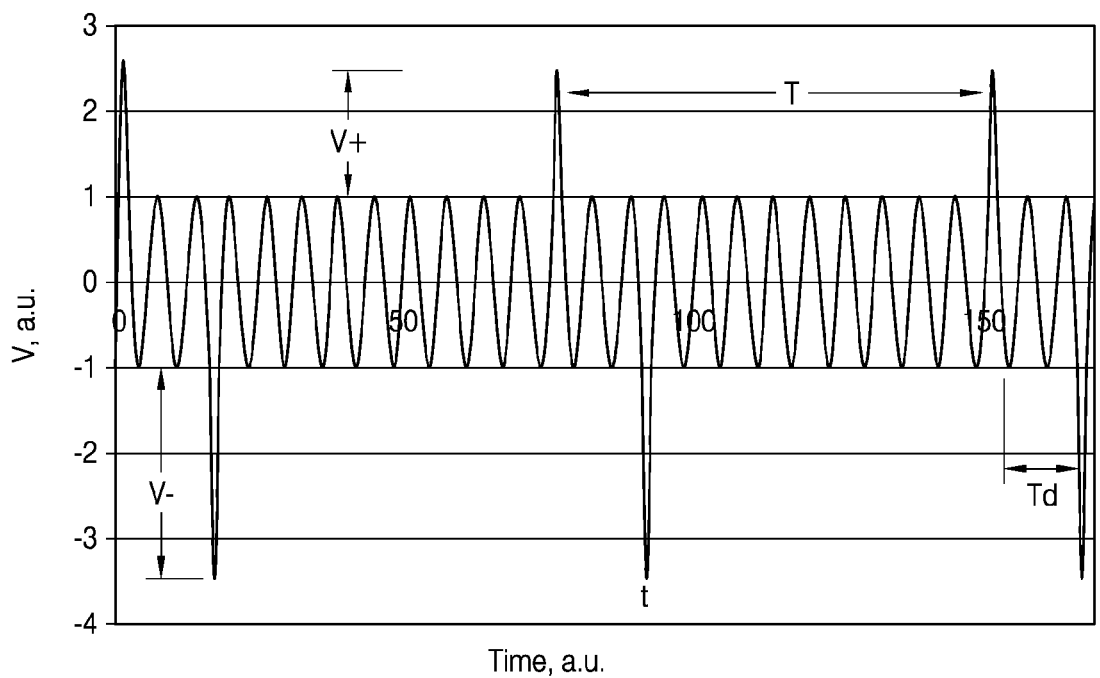
FIGS. 2A and 2B are exemplary waveforms illustrating the increased voltage biasing applied to the semiconductor device during plasma etching using the system of FIG. 1.
Figure 2B:
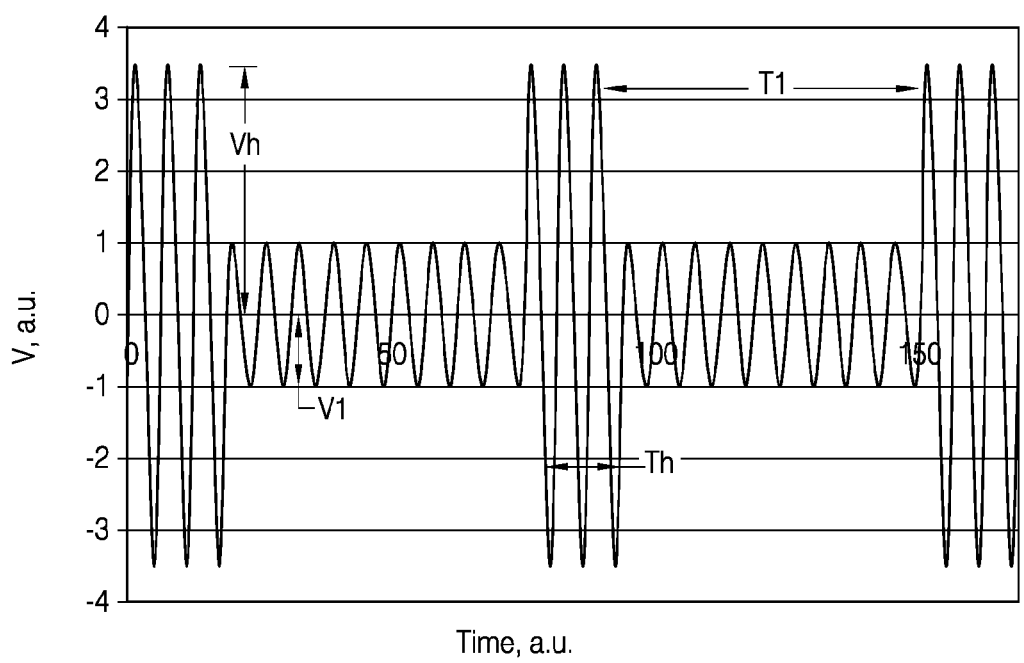

FIGS. 2A and 2B provide two illustrative waveforms of RF voltage signals that are applied to the plasma chambers 102a, 102b to transform the plasma gas into a plasma and to reduce accumulation of surface charge on the semiconductor device during the plasma etching process. The typical RF signal that is supplied to a plasma etching chamber to produce plasma comprises a voltage signal having a peak to peak amplitude in the range of 250–1000 volts at a frequency in the RF or megahertz range. The exact voltage and frequency will, of course, vary depending upon the gases within the chamber 102, the desired etch rate, surface geometry, composition, etc. In addition, etch tools provided by different manufacturers operate at different frequencies. As is illustrated in FIGS. 2A and 2B, the systems 100a, 100b contemplate periodically providing increased amplitude voltage bias waveforms of either positive and negative polarity or both to the chambers 102a, 102b during the plasma etching process so as to reduce surface charge accumulation on the surface of the semiconductor wafers 104.

As is illustrated in FIG. 2A, in one embodiment, the control units 116a, 116b induce the power supplies to periodically provide increased positive and negative amplitude voltage waveforms that have magnitudes substantially larger, e.g., at least 1.5 times larger and preferably 3 to 4 times larger, than the magnitude of the normal positive and negative voltage waveforms being provided to the chambers 102a, 102b during the plasma etching process. In particular, in this example, a positive voltage waveform is provided periodically at a period T and a negative voltage waveform is also provided at a period T wherein the positive and negative voltage waveforms are offset by a period $T_d$. The increased magnitude positive and negative voltage waveforms are provided to the chamber while the RF voltage is being supplied to transform the plasma gas into a plasma. As these waveforms are periodically provided in addition to the RF voltage signal that is being provided, they do not substantially affect the transformation of the plasma gas into the plasma state.

The actual increased magnitude of the positive and negative voltage waveforms and the frequency at which they are provided will vary depending upon the actual accumulation of charge on the semiconductor wafers being plasma etched. Similarly, the offset period $T_d$ can also be adjusted in order to improve the dissipation of charge on the semiconductor wafers 104. In one example, an RF voltage signal is provided having a peak to peak voltage of 150V at a frequency of 13.56 MHz. A positive voltage waveform having a peak positive voltage of 115V is provided once during a period of 4 μs and a peak negative voltage having a magnitude of −115V is provided once during a period of 4 μs with the offset period $T_d$ being approximately 1–2 μs The systems 100a, 100b can also be adapted to apply a waveform similar to the waveform illustrated in FIG. 2B. In FIG. 2B, the bias power of the power supply is modulated while the RF voltage signal is being supplied to the chamber such that, during certain periods of time $T_h$, the magnitude of the positive and negative voltages being applied from the power supplies is increased to a greater magnitude $V_h$ than the normal magnitude $V_1$ that is otherwise supplied to the chamber. Hence, with the waveform of FIG. 2B, both a higher positive and negative voltage waveform is periodically applied to the semiconductor wafers during the plasma etching process. In one example, the system 100 provides a voltage signal that has a voltage $V_1$ of 150V at a frequency of 15.56 MHz and the system 100 provides an increased bias voltage $V_h$ of 250V for a period $T_h$ of 0.15 μs wherein the periods $T_h$ are separated by a period $T_L$ of 2 μs.

It will be appreciated that the RF etching systems 100a, 100b are therefore adapted to provide an RF frequency voltage bias to produce the plasma within the chamber in a normal manner. However, the semiconductor devices 104 are periodically biased by an increased amplitude or magnitude voltage waveform that can either be a positive amplitude voltage waveform or a negative amplitude voltage waveform or both. As will be described in greater detail below, the increased amplitude voltage waveform that is applied during the plasma etching process facilitates dissipation of accumulated charge on the semiconductor wafer and thereby improves etching depth and etching uniformity.

It will be appreciated that the frequency and magnitude of the increased amplitude voltage waveforms during the plasma etching process will vary depending upon the plasma etching parameters, the topography of the wafer being etched and other process parameters. While the waveforms of FIGS. 2A and 2B illustrate both positive and negative increased amplitude voltage waveforms being applied to the semiconductor wafer, it will also be appreciated that, in some circumstances, it may be desirable to only apply increased amplitude voltage waveforms of a single polarity in order to dissipate charge on the semiconductor wafers 104.

Moreover, while in embodiments illustrated herein the increase voltage level is significantly higher, e.g., 1.5 times higher the peak positive and negative voltage levels, the process parameters can be selected so that a smaller charge dissipation signal is periodically provided to the wafers without departing from the spirit of the present invention. Hence, any increase in the process margin can result in an increase in the charge dissipation. Consequently, pulses which have, for example, a 25% increase in magnitude over the steady state voltage will increase the process margin against lower yields and/or failed parts.

Figure 3A:
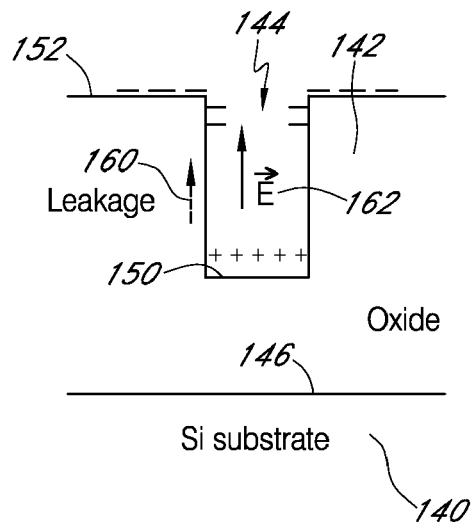
FIGS. 3A and 3B are schematic illustrations of a portion of a semiconductor device illustrating the interaction of the surface charge as the semiconductor device is exposed to the increased voltage biases during the plasma etching process using the system of FIG. 1.
Figure 3B:
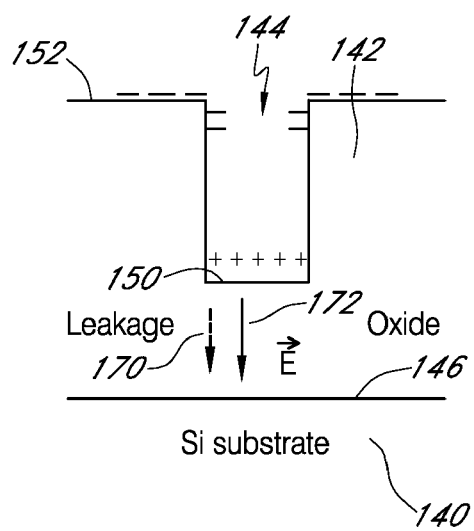

FIGS. 3A and 3B illustrate the mechanisms by which the surface charge is being dissipated as a result of the application of the increased voltage waveform during the RF etch process. In particular, FIGS. 3A and 3B illustrate a silicon substrate 140 that has a layer of oxide 142, such as BPSG oxide, formed on a first surface 146 of the substrate 140. The oxide 142 is being etched so as to define an opening 144. The opening 144 can, for example, comprise a trench or via or can also form an opening into which a 3-dimensional capacitor structure is to be formed. A masking material, such as photoresist, is present at its upper surface 152.

As is illustrated in FIGS. 3A and 3B, the plasma etching process typically results in positive charge accumulating at the bottom surface 150 of the opening 144 and negative charge accumulating about the upper surface 152. In this example, the positive charge accumulates at the bottom surface 150 and the negative charge accumulates on the upper surface 152 as a result of the reactive ions in the plasma having a relatively anisotropic direction distribution. The anisotropic nature of the reactive ions' direction distribution results in the ions traveling into the opening 144 towards the bottom surface 150. Moreover, the electrons have a more nearly isotropic distribution of directions so the electrons tend to accumulate near the top of the features of the semiconductor wafer.

The Applicant has performed numerous tests as to the results of applying high voltages to semiconductor wafers during plasma etching processes. The Applicant has determined that when an increased positive amplitude voltage waveform or signal, such as the waveforms or signals discussed above in connection with FIGS. 2A and 2B, is applied to the semiconductor wafer, the positive charge that is accumulated on the bottom surface 150 of the opening 144 is induced to move in the direction of the arrow 160 as a result of the electric field 162. The positive charge is thus likely to interact and recombine with the negative charge on the upper surface 152 to thereby reduce both accumulations of the positive charge on the bottom surface 150 of the opening 144 and also accumulations of negative charge about the upper surface 152 surrounding the opening 144.

Similarly, FIG. 3B illustrates that when an increased negative amplitude voltage waveform or signal, such as the waveforms or signals discussed above in connection with FIGS. 2A and 2B, is applied to the semiconductor wafer 104 during the plasma etching process, the positive charge that is accumulated on the bottom surface 150 of the opening 144 is thus urged in the direction of the arrow 170 as a result of the electric field 172. A leakage current path is thereby created through the oxide layer 142 to the substrate 140 further reducing the accumulations of positive charge on the bottom surface 150 of the opening 144.

Hence, by applying increased positive and negative amplitude voltage biases during the plasma etching process, accumulated charge, both on the upper surface of the semiconductor device and within openings that are being etched into the device, can be dissipated by inducing the charge to travel along these two possible leakage paths. In this way, the application of the increased amplitude voltage waveforms during the plasma etching process results in a reduction of charge carriers thereby allowing for more efficient etching and greater uniformity of plasma etching.

The Applicant has conducted several experiments which are indicative of the two leakage paths described above in connection with FIGS. 3A and 3B. For example, a wafer with 1.65 mm deep holes at the center and 1.8 mm deep holes at the edge was positioned within a type TCP9400 LAM plasma reactor manufactured by Lam Research Inc. of Fremont, Calif. at a pressure of 18 mTorr with a source power of 450 to 750 watts in the presence of an Ar plasma gas. The wafer had a pre-etched thickness of BPSG film of approximately 2.2 microns at the center and 2.51 microns at the edge. Therefore, the remaining BPSG thickness was approximately 0.55 microns at the center and 0.35 microns at the edge. The surface voltage was then measured and plotted based upon radial location and the results are summarized in FIGS. 4A and 4B.

Figure 4A:
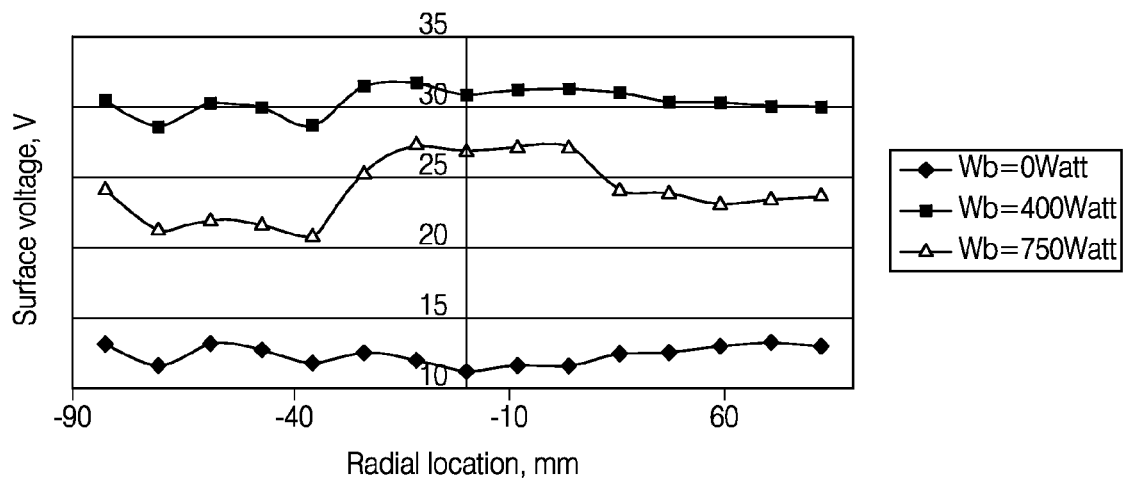
FIGS. 4A and 4B are plots of surface charge measurement illustrating the mechanism by which surface charge is reduced during plasma etching as a result of applying the increased voltage biases.

FIG. 4A demonstrates that the surface voltage throughout the entire wafer increases when higher wattage is applied in the plasma reaction chamber across the entire wafer as is evidenced by the surface voltage at 400 watts being on the order of 30 volts as opposed to being on the order of 11 volts when 0 watts is applied. The increase in surface voltage is indicative of an increase in charge accumulated on the wafer as a result of more charged particles being directed towards the upper surface of the wafer when exposed to higher wattage plasma. However, as is evidenced by FIG. 4A, when the wattage is increased to 750 watts, the surface voltage decreases indicating that accumulated charge on the surface of the wafer has been dissipated as a result of the increase in wattage being applied to the chamber. Moreover, FIG. 4A further illustrates that a change in the bias power also results in the change in the shape of the distribution of the surface voltage across the wafer. For the wafer at low bias power there is a higher relative surface voltage at the edge where the holes are deeper. At higher bias power, there is a lower surface voltage at the edge as compared to the center of the same wafer. The Applicant believes that this is possibly the result of the oxide at the edge being thinner which results in increased charged leakage between the bottom of the holes and the underlying silicon substrate.

Figure 4B:
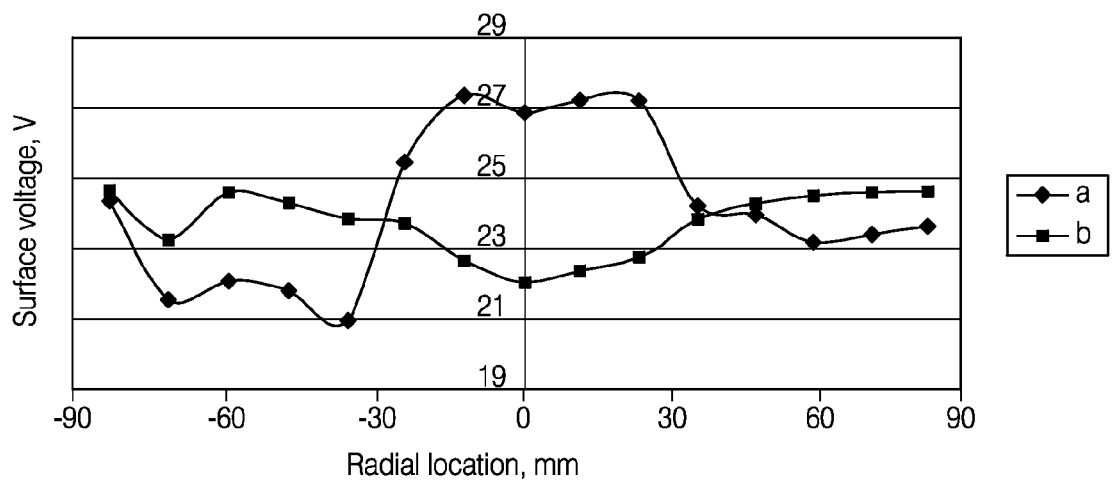

FIG. 4B indicates that the change in the surface voltage distribution as a result of a change in the bias power is not directly related to the change in plasma uniformity. FIG. 4B illustrates that for holes with relatively large thicknesses of oxide between the hole and the substrate, i.e., holes at the edge of the wafer, the surface voltage is higher for deeper holes, while the surface voltage is lower on the wafer adjacent the deeper holes with thinner remaining oxide when the wafers are charged with the same plasma biased power. Hence, FIGS. 4A and 4B illustrate the two possible leakage paths discussed above.

From the foregoing, it will be appreciated that the plasma etch system and method described above reduces the amount of surface charge on the semiconductor wafer or device being etched. This reduction in surface charge results in less interference between a build-up of charge and subsequently accelerated reactive ions and the material that is to be etched. Hence, there is a greater uniformity of plasma etching and also an improved ability to etch openings to greater depth using the system and the technique discussed above.

As discussed above, the preferred embodiment has described the process of reducing accumulated charge during a plasma process in connection with etching a via in a semiconductor device. However, it will be appreciated that charge accumulations can occur during a number of different plasma processes including plasma induced chemical vapor deposition. Hence, by periodically providing an increased bias waveform during the plasma process, the charge can be dissipated regardless of whether the operation is a etching process, a deposition process or some other process that uses plasma.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art without departing from the spirit of the present invention. Consequently, the scope of the present invention should not be limited to the foregoing discussion but should be defined by the appended claims.

What is claimed is:

1. A method of plasma etching a semiconductor device, the method comprising:

positioning a semiconductor device in a chamber;

plasma etching the semiconductor device so as to form an opening in an exposed region of the semiconductor device, wherein the plasma etching includes providing a voltage waveform having a peak to peak amplitude at a first level to the chamber so as to generate a plasma into a selected state; and dissipating both positive and negative charge accumulated on the semiconductor device while plasma etching the semiconductor device by periodically applying an increased positive and negative amplitude voltage waveform having a selected increased peak to peak amplitude that is greater than the peak to peak amplitude of the voltage waveform to the chamber during the plasma etching process, wherein the peak to peak amplitude of the voltage waveform is maintained substantially at the first level when the increased positive and negative amplitude voltage waveform is not being applied, and wherein the first level and increased values of the peak to peak amplitude are selected so as to substantially maintain generation of the plasma into the selected state.

2. The method of claim 1, wherein plasma etching the semiconductor device comprises:

introducing a plasma gas into the chamber to thereby allow the voltage waveform to transform the plasma gas into a plasma; and inducing the plasma to travel towards the exposed region of the semiconductor device.

3. The method of claim 1, wherein supplying the voltage waveform to the chamber comprises supplying a voltage signal having a magnitude of between 100 and 1000 volts peak to peak at a frequency in approximately the megahertz range.

4. The method of claim 1, wherein the increased positive and negative amplitude voltage waveform is selected so as to induce accumulated charge adjacent the bottom surface of an opening formed in the semiconductor device during the plasma etching to move out of the opening towards an upper surface of the semiconductor device and recombine with oppositely charged accumulated charge on the upper surface of the semiconductor device thereby reducing the total amount of the accumulated charge on the semiconductor device during etching.

5. The method of claim 1, wherein the increased positive and negative amplitude voltage wavefonn is selected so as to induce accumulated charge adjacent the bottom surface of an opening formed in the semiconductor device to travel into a substrate of a semiconductor device to thereby dissipate the charge accumulated adjacent the bottom surface of the opening.

6. A method of performing a plasma process on a semiconductor device comprising:
positioning a semiconductor device having a substrate in a chamber;
introducing a plasma gas into the chamber;
supplying a radio-frequency signal having a first positive peak voltage and a first negative peak voltage to the chamber so as to transform the plasma gas into a plasma in a selected state; and
modulating the radio-frequency signal supplied to the chamber to yield a selected periodically increased positive peak voltage and negative peak voltage that are respectively greater than the first positive peak voltage and the first negative peak voltage, so as to reduce accumulation of positive and negative charge on the semiconductor device during the plasma process by both inducing recombination of positive and negative charge existing on the semiconductor device and inducing leakage of positive charge through the substrate, wherein the first positive peak voltage and the first negative peak voltage are substantially maintained when the increased positive and negative peak voltages are not being applied, and wherein the first positive and negative peak voltages and increased positive and negative peak voltages are selected so as to substantially maintain the transformation of the plasma gas into the plasma in the selected state.

7. The method of claim 6, wherein the increased positive and negative peak voltages have values that are at least approximately 1.5 times the values corresponding to the first positive peak and first negative peak voltages.

8. The method of claim 7, wherein the increased positive and negative peak voltages have values that are approximately 3–4 times the values corresponding to the first positive peak and first negative peak voltages.

* * * * *